United States Patent [19]
Capasso et al.

[11] Patent Number: 6,144,681
[45] Date of Patent: Nov. 7, 2000

[54] ARTICLE COMPRISING A DUAL-WAVELENGTH QUANTUM CASCADE PHOTON SOURCE

[75] Inventors: Federico Capasso, Westfield; Alfred Yi Cho, Summit, both of N.J.; Jerome Faist, Neuchatel, Switzerland; Albert Lee Hutchinson, Piscataway, N.J.; Carlo Sirtori, Paris, France; Deborah Lee Sivco, Warren; Alessandro Tredicucci, Summit, both of N.J.

[73] Assignee: Lucent Technologies Inc., Murray Hill, N.J.

[21] Appl. No.: 09/033,250

[22] Filed: Mar. 2, 1998

[51] Int. Cl.$^7$ ........................................................ H01S 3/19
[52] U.S. Cl. ................................ 372/45; 257/14; 372/23; 372/50
[58] Field of Search .................................. 372/45, 23, 50; 257/14

[56] References Cited

U.S. PATENT DOCUMENTS

| | | | |
|---|---|---|---|
| 5,457,709 | 10/1995 | Capasso et al. | 372/45 |
| 5,509,025 | 4/1996 | Capasso et al. | 372/45 |
| 5,570,386 | 10/1996 | Capasso et al. | 372/46 |
| 5,999,553 | 12/1999 | Sun | 372/23 |

OTHER PUBLICATIONS

"Sensitive Absorption Spectroscopy with a Room–Temperature Distributed–Feedback Quantum–Cascade Laser", by K. Namjou et al., *Optics Letters*, vol. 23, No. 3, Feb. 1, 1998, pp. 219–221.
"Air Monitoring by Spectroscopic Techniques", edited by M. W. Sigrist, John Wiley & Sons, Inc., (1994).
"Correlated Spontaneous–Emission Lasers: Quenching of Quantum Fluctuations in the Relative Phase Angle", by M. O. Scully, *Physical Review Letters*, vol. 55, No. 25, Dec. 16, 1985, pp. 2802–2805.
"Multichromatic Operations in cw Dye Lasers" by H. Fu et al., *Physical Review Letters*, vol. 60, No. 25, Jun. 20, 1988, pp. 2614–2617.
"A Gaseous (He–Ne) Cascade Laser", by H. J. Gerritsen et al., *Applied Physics Letters*, vol. 4, No. 1, Jan. 1, 1964, pp. 20–21.
"Nonparabolicity and a Sum Rule Associated with Bound–to–bound and Bound–to–continuum Intersubband Transitions in Quantum Wells", by C. Sirtori et al., *Physical Review B*, vol. 50, No. 12, Sep. 15, 1994, pp. 8663–8674.
Sirtori et al., *Optic Letters*, "Dual Wavelength Emission from Optically Cascaded Intersubband Transitions", vol. 23, No. 6, Mar. 15, 1998, pp. 463–465.
Namjou et al., *Optics Letters*, "Sensitive Absorption Spectroscopy with a Room–Temperature Distributed–Feedback Quantum–Cascade Laser", vol. 23, No. 3, Feb. 1, 1998, pp. 219–221.
Sirtori et al., *Applied Physics Letters*, "Continuous Wave Operation of Midinfrared (7.4–8.6$\mu$m) Quantum Cascade Lasers up to 110 K Temperature", vol. 68, No. 13, Mar. 25, 1996, pp. 1745–1747.

(List continued on next page.)

*Primary Examiner*—James W. Davie
*Attorney, Agent, or Firm*—Eugene E. Pacher

[57] ABSTRACT

The quantum cascade (QC) photon source according to this invention can emit simultaneously at two distinct wavelengths, typically both in the mid-infrared. This is accomplished through provision of a semiconductor layer structure in which, at the proper bias voltage, electrons are injected into an energy level $E_3$ and then forced to cascade through an intermediate level $E_2$ before reaching the ground state $E_1$ of the active region. In the process, photons of energy $E_3$–$E_2$ (wavelength $\lambda_1$) and $E_2$–$E_1$ (wavelength $\lambda_2$) are emitted. Dual wavelength photon sources according to this invention can be used in a variety of ways, e.g., to determine the absorption of a gaseous sample at wavelengths $\lambda_1$ and $\lambda_2$, exemplarily to determine the concentration of a particular chemical compound in the sample.

8 Claims, 2 Drawing Sheets

OTHER PUBLICATIONS

Sirtori et al., *Applied Physics LettersApplied Physics Letters*, "Long Wavelength Infrared ($\gamma \cong 11$ μm) Quantum Cascade Lasers", vol. 69, No. 19, Nov. 4, 1996, pp. 2810–2812.

Sirtori et al., *Proceedings of the SPIE, The International Society of Optical Enginnering*, "Mid–IR Intersubband Quantum Cascade Lasers", vol. 3284, pp. 212–223.

Sirtori et al., *Proceedings of the 1997 Conference on Lasers and Electro–Optics, CLEO*, "Dual Wavelength Intersubband Emitters", vol. 11, May 18, 1997, pp. 425–426.

ARTICLE COMPRISING A DUAL-WAVELENGTH QUANTUM CASCADE PHOTON SOURCE

GOVERNMENT CONTRACT

This invention was made with Government support under Office of Naval Research Contract No. N00014-96-C-0288. The Government has certain rights in this invention.

FIELD OF THE INVENTION

This invention pertains to quantum cascade (QC) photon sources, and to apparatus and systems that comprise such a source, exemplarily a laser or light emitting diode.

BACKGROUND

Recently a new class of semiconductor lasers, designated "quantum cascade" or "QC" lasers, was discovered. See, for instance, U.S. Pat. Nos. 5,457,709, 5,509,025 and 5,570,386, all incorporated herein by reference. See also U.S. patent applications Ser. No. 08/825,286 (filed Mar. 27, 1997) now U.S. Pat. No. 5,978,397 and Ser. No. 08/744,292 (filed Nov. 6, 1996), now U.S. Pat. No. 5,745,516, both incorporated herein by reference.

A "quantum cascade" or "QC" photon source is a unipolar semiconductor device having a multilayer structure that forms an optical waveguide, including a core region of relatively large effective refractive index between confinement regions of relatively small effective refractive index. The core region comprises a multiplicity of nominally identical repeat units, with each repeat unit comprising an active region and a carrier injector region. The active region has a layer structure selected to provide an upper and a lower carrier energy state, and such that a carrier transition from the upper to the lower energy state results in emission of a photon of wavelength $\lambda$. The carrier injector region has a layer structure selected to facilitate carrier transport from the lower energy state of the active region of a given repeat unit to the upper energy state of the active region of the adjacent (downstream) repeat unit. A carrier thus undergoes successive transitions from an upper to a lower energy state as the carrier moves through the layer structure, resulting in the creation of a multiplicity of photons of wavelength $\lambda$. The photon energy (and thus $\lambda$) depends on the structural and compositional details of the repeat units, and possibly also on the applied electric field and/or a distributed feedback element.

Prior art QC photon sources can be designed to emit at wavelengths in a wide spectral region of the infrared, exemplarily 3–13 $\mu$m. Such sources (especially lasers) have a variety of potential uses, e.g., trace gas analysis, environmental monitoring, industrial process control, combustion diagnostics, and medical diagnostics. See, for instance, K. Namjou et al., *Optics Letters*, Vol. 23.p. 219 (1998).

In at least some of the potential uses (as well as in quantum optics studies) it would be desirable to have available a semiconductor photon source that emits at more than one wavelength. Exemplarily, such a source would be extremely useful for those techniques, like differential absorption lidar (DIAL), where light scattering has to be evaluated and compared at two different wavelengths. See M. Sigrist, editor, "Air Monitoring by Spectroscopic Techniques", Wiley, New York (1994). In addition, if the photons that are emitted at the two wavelengths are correlated, then such a source would make it possible to eliminate spontaneous emission noise in measurements that require beating or heterodyning of two laser radiations. See, for instance, M. 0. Scully, *Phys. Rev. Letters*, Vol. 55, p. 2802 (1985). This application discloses such a photon source.

The above referenced '286 application inter alia discloses a QC laser with divided electrode that can have dual wavelength emission. Such a laser needs three terminals and thus requires more complex circuitry, and the two wavelengths have relatively small separation. Lasing on two or more coupled transitions has previously been observed in dye molecules and HeNe-based gaseous mixtures. See H. Fu et al., *Phys. Rev. Letters*, Vol. 60, p. 2614 (1988), and H. J. Gerritsen et al., *App. Physics Letters*, Vol. 4, p. 20 (1964), respectively.

SUMMARY OF THE INVENTION

The invention is embodied in an article that comprises a novel QC photon source that is structured to emit radiation at a wavelength $\lambda_1$ and at a wavelength $\lambda_2$. Typically both $\lambda_1$ and $\lambda_2$ are in the infrared.

More specifically, the QC photon source comprises a substrate and a semiconductor structure disposed on the substrate, the structure comprising, in sequence in a direction normal to the substrate, a multiplicity of essentially identical repeat units, with each repeat unit comprising a multiplicity of layers. The QC photon source further comprises a first and a second contact for applying an electrical bias across the semiconductor structure.

Significantly, a given repeat unit, disposed contactingly between an upstream and a downstream repeat unit, comprises an active region comprising at least one quantum well disposed between an upstream and a downstream barrier layer, with the at least one quantum well selected such that, under an applied bias, the active region supports at least three electron energy levels, with the injector of the upstream repeat unit injecting electrons into the highest of said at least three electron energy levels, with electrons from said highest electron energy level making a transition to an intermediate electron energy level, with electrons from the intermediate electron energy level making a transition to the lowest of said at least three electron energy levels, and with electrons from said lowest electron energy level being transmitted through the injector of the given repeat unit into the highest electron energy level of the downstream repeat unit. Emission of photons of wavelength $\lambda_1$ is associated with the transition from the highest to the intermediate energy level, and emission of photons of wavelength $\lambda_2$ is associated with the transition from the intermediate to the lowest energy level.

Repeat units are "essentially identical" if they differ only due to the presence of substantially unavoidable manufacturing differences.

DETAILED DESCRIPTION

QC photon sources according to this invention can emit simultaneously at two distinct wavelengths, typically both in the mid-infrared. This is accomplished through provision of a semiconductor layer structure in which, at the proper bias voltage, electrons are injected into an energy level $E_3$ and then forced to cascade through an intermediate level $E_2$ before reaching the ground state $E_1$ of the active region. In the process, photons of energy $E_3$–$E_2$ (wavelength $\lambda_1$) and $E_2$–$E_1$ (wavelength $\lambda_2$) are emitted. QC photon sources according to this invention herein frequently will be referred to as "lasers", although non-lasing sources (typically LEDs) are also contemplated, and are intended to be included in the term "lasers".

Figure 1:
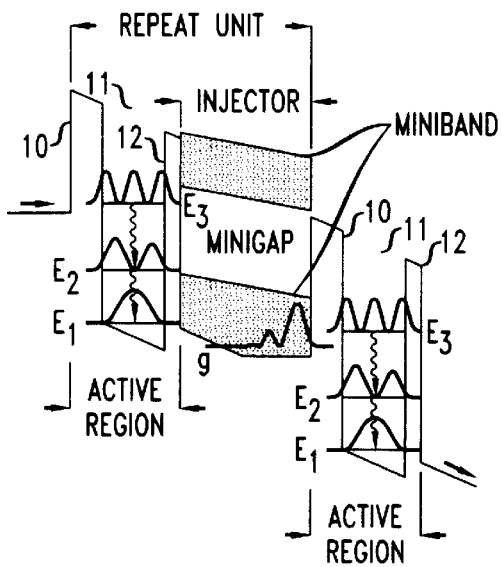
FIG. 1 schematically depicts a relevant portion of the conduction band edge of a dual-wavelength photon source according to the invention.

FIG. 1 schematically illustrates an exemplary embodiment of the invention. The conduction band edge of a complete repeat unit is shown, together with the band edge of the active region of the neighboring downstream repeat unit. A repeat unit is assumed to extend from barrier layer 10 of the given repeat unit to barrier layer 10 of the adjacent downstream repeat unit. This is for the sake of concreteness only, and different definitions of the repeat unit could be made.

The active region of the repeat unit comprises upstream barrier layer 10, quantum well 11, and downstream barrier layer 12. The injector comprises the remainder of the repeat unit, and will be described in detail below. The quantum well is selected to have at least three electron energy levels, designated $E_3$, $E_2$ and $E_1$. The figure also shows the computed square moduli of the wavefunctions for the three energy levels. The wavy arrows indicate the radiative transitions from $E_3$ to $E_2$, and from $E_2$ to $E_1$.

Those skilled in the art will appreciate that in a QC laser an optical waveguide structure is provided, with the core of the waveguide comprising a multiplicity (e.g., 10 or more) of essentially identical repeat units, the core being sandwiched between an upper and a lower confinement region, with the confinement regions having lower effective refractive index than the core. The confinement regions are described below.

The semiconductor structure of the exemplary embodiments of the invention discussed herein was grown by molecular beam epitaxy (MBE) in the AlInAs/GaInAs material system, lattice matched to the InP substrate.

In FIG. 1, the band edge is shown at a bias field of 62 kV/cm. Quantum well 11 is 11 nm thick, and barriers 10 and 12 are, respectively, 5.5 and 3.2 nm. The injector is a n-type doped (to avoid space-charge effects) 36.6 nm digitally graded alloy which serves as a relaxation region for the preceding stage. The thicknesses (in nm) of the layers of the injector (from left to right in FIG. 1) were as follows: 4.4/1.6*/3.8/1.8*/3.4/2.0*/3.2/2.3*/3.2/2.3*/3.0/2.8*/2.8, with the AlInAs barrier layers being starred, and with the underlined layers being Si-doped (n=1×10$^{17}$/cm$^3$).

In FIG. 1, the "miniband" regions indicate the energy and spatial extension of the manifold of band-like states of the digitally graded alloy, and the "minigap" region indicates the energy and spatial extent of the region of vanishingly small density of states. The computed square modulus of the groundstate wavefunction g of the injector is also shown in FIG. 1.

In the structure of FIG. 1, both optical transitions are "vertical", with resulting large dipole matrix elements ($Z_{32}$= 2.7 nm, $Z_{21}$ =2.3 nm). However, lasers according to the invention are not limited to vertical transitions, as will be shown below.

In the structure of FIG. 1, the intersubband scattering times between the relevant states are determined by optical phonon emission and are longer for larger energy separations. We have calculated that $\tau_{32}$=1.24 ps, $\tau_{21}$=0.83 ps, and $\tau_{31}$ =2.08 ps. For details of the calculations see C. Sirtori et al., *Physical Review B*, Vol. 50, p. 8663 (1994). The lifetime $\tau_1$ of the groundstate $E_1$ is substantially determined by tunneling and scattering into the injector miniband and is typically relatively short, about 0.5 ps. On the other hand, the escape rates from states $E_3$ and $E_2$ are kept relatively small by designing the injector to act as an electron Bragg reflector at those energies. Since $\tau_{32}$>$\tau_{21}$, and $\tau_{21}$>$\tau_1$, the condition for population inversion, essential for laser action of the two optical transitions, is satisfied.

Figure 2:
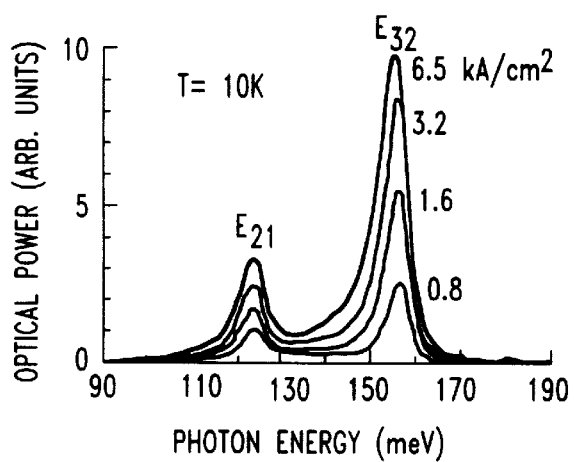
FIG. 2 shows exemplary data on emitted optical power vs. photon energy for a source according to FIG. 1.

FIG. 2 shows the electroluminescent spectrum of the structure of FIG. 1, for several current densities. As can be seen from the figure, two distinct peaks were observed. The peaks had full width at half maximum (FWHM) of about 8 meV, with peak optical power at energies corresponding to wavelengths 8.1 μm and 10 μm, respectively, corresponding to the transitions $E_3$–$E_2$ and $E_2$–$E_1$, respectively.

For the elctroluminescence measurements, ten repeat units were grown, sandwiched between two thick n$^+$InGaAs contact layers, on a semi-insulating substrate. The structure was then processed into 125 μm diameter circular mesas by wet chemical etching, and wedged at 45° to couple out the emitted light.

The data of FIG. 2 confirm that, at the appropriate bias, nearly all electrons pass through $E_3$ before reaching $E_2$. The confirmation is provided by the peak ratio becoming substantially unity, once compensated for the differences in oscillator strength and detection efficiency.

Twenty-five repeat units between confinement layers were grown on an n-type doped InP substrate and processed into ridge waveguides 18 μm wide and 3.5 mm long, mesa etched through the active regions. The lower confinement region comprised a 700 nm InGaAs (n=6×10$^{16}$) layer, and the upper cladding region comprised the following layer sequence: 500 nm InGaAs (n=6×10$^{16}$)/1200 nm AlInAs (n=2×10$^{17}$)/200 nm AlInAs (n=3×10$^{17}$)/700 nm InGaAs (n=7×10$^{18}$).

The repeat unit active region consisted of a 11.5 nm quantum well between a 5.7 nm upstream barrier and a 3.2 nm downstream barrier. The injector layer sequence was as follows, using the same conventions as above: 4.4/1.6*/3.7/1.8*/3.3/1.9*/3.1/2.3*/3.0/2.7*/3.0, with doping n=1.5×10$^{17}$.

Figure 3:
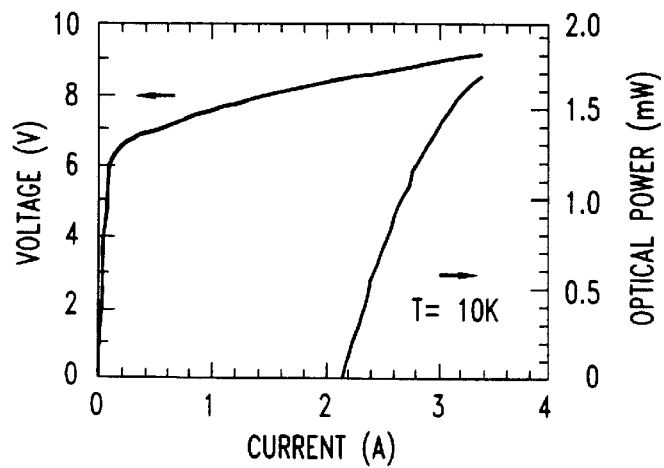
FIG. 3 shows exemplary data on voltage and emitted optical power vs. current.
Figure 4:
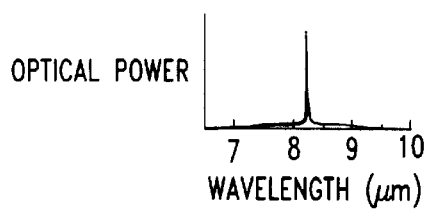
FIG. 4 shows exemplary data on emitted optical power vs. wavelength.

FIG. 3 shows the light-current and voltage-current characteristics of an exemplary device as described above, in pulsed mode at 10K. FIG. 4 shows the spectrum of the device just above threshold. Lasing clearly occurred at the $E_3$–$E_2$ transition. Optimization of the structure is expected to result in lasing at the $E_2$–$E_1$ transition also.

Figure 5:
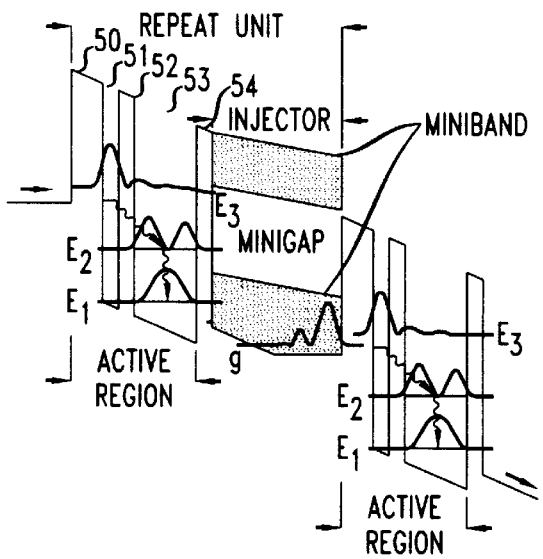
FIG. 5 schematically depicts a relevant portion of the conduction band edge of a further dual-wavelength photon source according to the invention.

Lifetimes, especially $\tau_{31}$, are improved in a further exemplary embodiment, schematically depicted in FIG. 5. The active region of the repeat unit consists of 5.4 nm thick AlInAs barrier 50, 2.2 nm thick well 51, 2.2 nm thick barrier 52, 8.8 nm thick well 53, and 2.4 nm thick barrier 54. As one can see from the figure, the $E_3$–$E_2$ transition is strongly diagonal in real space, and the $E_2$–$E_1$ transition is vertical. A structure according to the invention could, if desired, also be designed such that both transitions are diagonal.

The diagonal transition of FIG. 5 has, at the design bias field of 73 kV/cm, the following computed lifetimes: $\tau_{32}=$ 3.2 ps, $\tau_{21}=1$ ps, $\tau_{31}=11.2$ ps, yielding a lifetime in state $E_3$ of 2.5 ps. The values of the dipoles and times depend on the applied electric field, due to the diagonal nature of the $E_3$–$E_2$ transition. The larger ratio of lifetimes $\tau_{32}/\tau_{21}$ in the structure with one diagonal transition, compared to the same ratio in the structure with the two vertical transitions, facilitates the onset of lasing action at lower pump current.

Figure 6:
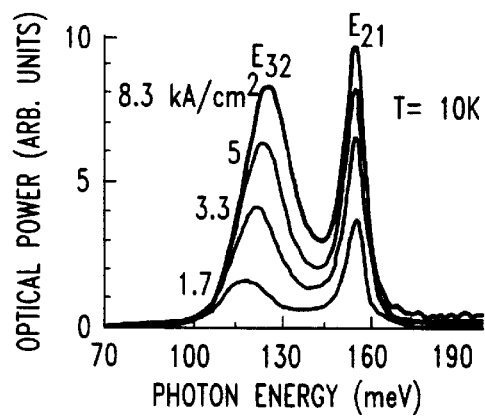
FIG. 6 shows exemplary data on emitted optical power vs. photon energy, for a source according to FIG. 5.

FIG. 6 shows the results of electroluminescence measurements on a sample with 10 repeat units as described above. Two clear peaks are present, with maxima at about 8 $\mu$m and 10 $\mu$m, respectively, in close correspondence to the $E_2$–$E_1$ and $E_3$–$E_2$ energies, respectively. Ridge waveguides were prepared from an analogous layer structure with 30 repeat units, with injector doped $3\times10^{17}$. The lower confinement layer was 680 nm InGaAs, doped n=$6\times10^{16}$. The upper confinement region was 330 nm InGaAs (n=$6\times10^{16}$)/1500 nm AlInAs (n=$1.2\times10^{17}$)/1100 nm AlInAs (n=$3\times10^{17}$)/700 nm InGaAs (n=$5\times10^{18}$). Lasing action was achieved in pulsed mode, up to 220K, on the diagonal transition. Optimization is expected to yield a dual wavelength device with correlated outputs.

Figure 7:
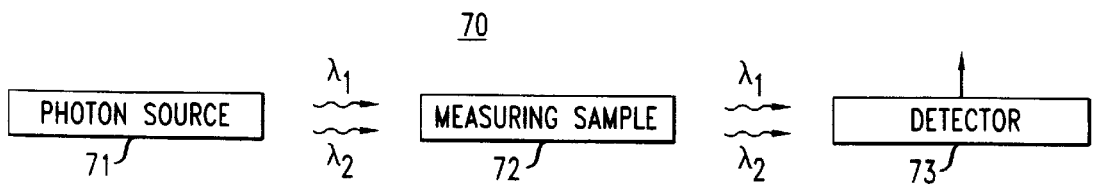
FIG. 7 schematically shows exemplary measuring apparatus according to the invention.

Dual wavelength quantum cascade photon sources can be used in a variety of ways, e.g., to determine the absorption of a gaseous sample at wavelengths $\lambda_1$ and $\lambda_2$, exemplarily to determine the concentration of a particular chemical compound in the measurement sample. FIG. 7 schematically shows such measuring apparatus 70, with numerals 71–73 referring, respectively, to the dual wavelength photon source, sample and detector. The measurement sample can be confined in a measuring cell or be unconfined.

The invention claimed is:

1. An article comprising a quantum cascade photon source comprising a substrate and a semiconductor structure disposed on the substrate, the semiconductor structure comprising, in sequence in a direction normal to the substrate, a multiplicity of essentially identical repeat units, with each repeat unit comprising a multiplicity of layers; the photon source further comprising a first and a second contact for applying an electrical bias across the semiconductor structure;

CHARACTERIZED IN THAT a given repeat unit, disposed contactingly between an upstream repeat unit and a downstream repeat unit, comprises an active region and an injector region, with the active region comprising at least one quantum well disposed between an upstream and a downstream barrier layer, with the at least one quantum well selected such that, under an applied bias, the active region supports at least three electron energy levels, with electrons from the injector of the upstream repeat unit being injected into the highest of said at least three energy levels, with electrons from said highest energy level making a transition to an intermediate energy level, with electrons from the intermediate energy level making a transition to the lowest of said at least three energy levels, and with electron from said lowest energy level being transmitted through the injector of the given repeat unit and into the highest energy level of the downstream repeat unit, wherein emission of photons of wavelength $\lambda_1$ is associated with said transition from the highest energy level to the intermediate energy level, and emission of photons of wavelength $\lambda_2$ is associated with said transition from the intermediate energy level to the lowest energy level.

2. Article according to claim 1, wherein the quantum cascade photon source is a quantum cascade laser.

3. Article according to claim 1, wherein the quantum cascade photon source is a quantum cascade light emitting diode.

4. Article according to claim 1, wherein each of the transitions from the highest energy level to the intermediate energy level and from the intermediate energy level to the lowest energy level is a vertical transition.

5. Article according to claim 1, wherein the transition from the highest energy level to the intermediate energy level is a diagonal transition.

6. Article according to claim 5, wherein the transition from the intermediate energy level to the lowest energy level is a diagonal transition.

7. Article according to claim 1, wherein said semiconductor structure comprises more than ten essentially identical repeat units.

8. Apparatus for measuring an absorption of a gaseous measurement sample at wavelengths $\lambda_1$ and $\lambda_2$, the apparatus comprising a dual wavelength photon source and one or more detectors for detecting radiation of wavelength $\lambda_1$ and $\lambda_2$, respectively, wherein said dual wavelength photon source is a quantum cascade photon source comprising a substrate and a semiconductor structure disposed on the substrate, the semiconductor structure comprising, in sequence in a direction normal to the substrate, a multiplicity of essentially identical repeat units, with each repeat unit comprising a multiplicity of layers; the photon source further comprising a first and a second contact for applying an electrical bias across the semiconductor structure; wherein a given repeat unit, disposed contactingly between an upstream repeat unit and a downstream repeat unit, comprises an active region and an injector region, with the active region comprising at least one quantum well disposed between an upstream and a downstream barrier layer, with the at least one quantum well selected such that, under an applied bias, the active regions supports at least three electron energy levels, with electrons from the injector of the upstream repeat unit being injected into the highest of said at least three energy levels, with electrons from said highest energy level making a transition to an intermediate energy level, with electrons from the intermediate energy level making a transition to the lowest of said at least three energy levels, and with electron from said lowest energy level being transmitted through the injector of the given repeat unit and into the highest energy level of the downstream repeat unit, wherein emission of photons of wavelength $\lambda_1$ is associated with said transition from the highest energy level to the intermediate energy level, and emission of photons of wavelength $\lambda_2$ is associated with said transition from the intermediate energy level to the lowest energy level.

* * * * *